INTEGRATED MAJORITY LOGIC CIRCUIT UTILIZING BASE-CONNECTED PARALLEL-TRANSISTOR PAIRS AND MULTIPLE-EMITTER TRANSISTOR

Filed July 30, 1964

INVENTOR.
GEORGE F. MARETTE
BY
Griffin and Stokes 3,378,695

INTEGRATED MAJORITY LOGIC CIRCUIT UTILIZING BASE-CONNECTED PARALLEL-TRANSISTOR PAIRS AND MULTIPLE-EMITTER TRANSISTOR

George F. Marette, Minneapolis, Minn., assignor to Sperry Rand Corporation, New York, N.Y., a corporation of Delaware Filed July 30, 1964, Ser. No. 386,157
13 Claims. (Cl. 307—211)

Figure 1:
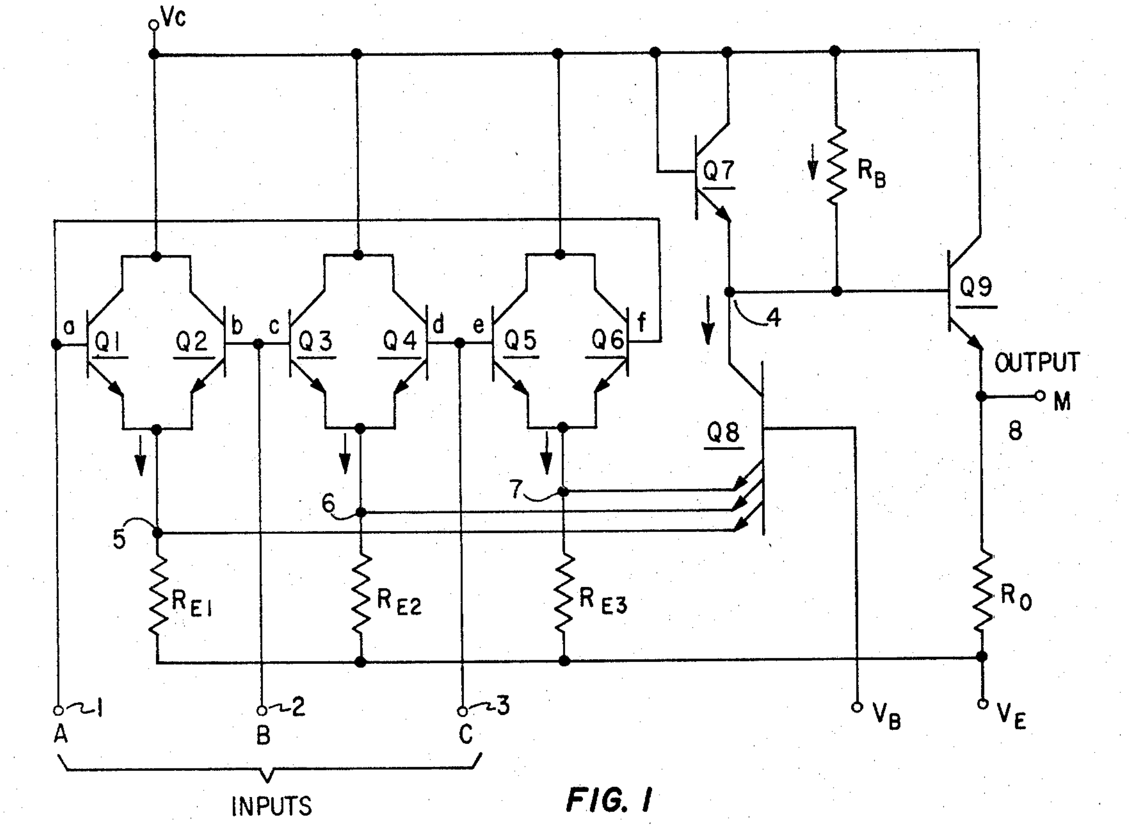

This invention relates to a solid state logic circuit which is generally adaptable to perform a plurality of logical functions, but more particularly, is admirably suited to provide a majority decision function.

Since the advent of large scale scientific computers and other data processing systems, there has been an increasing demand for faster operating speeds coupled with inexpensive packaging of electronic circuitry in the smallest possible volume. The latter requirement of high density circuit packaging obviously may only be approached by use of solid state components such as transistors, tunnel diodes, and the like as the active elements in a logical circuit. However, the upper limit of high frequency operation of transistors is determined in part by the transistor storage time which occurs when a transistor is operated in saturation. Storage time results from minority carriers being in the base region of the transistor at the moment when the input current is cut off. These carriers require a definite length of time to be collected, with said length being essentially governed by the degree of saturation into which the transistor is driven and the time spent in saturation. Thus, for high speed switching as is required in a logic circuit, storage time is an undesirable condition. Nonsaturating circuitry can be designed with prior art individual transistor components, but this usually requires a larger number of transistors for the same logic function and thus has been regarded by many as being too expensive. Consequently, saturating logic circuits have been typical of most prior art devices until the recent advent of the so-called "integrated" circuit which is a new concept in semiconductor packaging. A characteristic of integrated circuits is the ease with which multiple transistors may be diffused onto one silicon chip. Because of this, very capable logic circuits may be designed with liberal use of transistors, costing no more and occupying no more volume than prior art individual transistor circuits. Thus, even though the present available integrated circuits are expensive, the volume-to-circuit cost ratio is equivalent to or better than that resulting from merely microminiaturizing discrete circuits. The advantages of obtaining high circuit density and increased logic capability appear to make integrated transistor logic circuits very attractive candidates for high-speed logic applications.

The present invention in one aspect provides a solid state transistorized circuit for performing the well known "majority decision" logical function without using current summing or any other such methods as have heretofore been employed in the prior art. A broader aspect of the invention, however, permits it to be easily modified for providing many other different logical functions according to the wishes of the system designer. Another advantage of the present invention is that it is an example of the nonsaturating current mode type of logic in which the chance of achieving a shorter propagation time is better because of the elimination of transistor storage time. Because this novel circuit further lends itself to manufacture in an integrated form, it is competitive with discrete type saturated transistor logic as regards the cost of manufacture and total volume required for the electrical components.

Therefore, one object of the present invention is to provide an improved majority decision circuit having decreased propagation time across a stage thereof.

Another object of the present invention is to provide a transistorized integrated logic circuit for performing a majority decision function having an average propagation time of from six to nine nanoseconds per stage.

A further object of the invention is to provide a logic circuit employing the use of a multiple emitter transistor component so as to avoid the need for any threshold or current summing operation.

Figure 2:
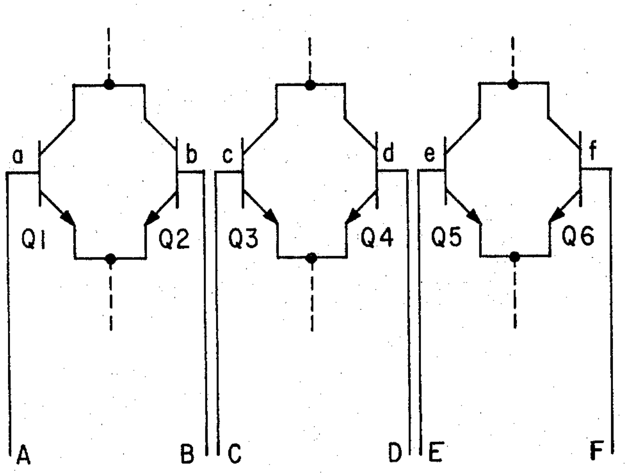

These and other objects of the present invention will become apparent during the course of the following description, to be read in view of the drawings, in which:

FIGURE 1 shows a circuit schematic of the majority decision circuit constituting one aspect of the present invention; and FIGURE 2 illustrates how the circuit of FIGURE 1 can be adapted for performing a plurality of different logical functions.

A novel two-out-of-three majority decision circuit is shown in FIGURE 1 to be comprised of three pairs of like polarity or conductivity transistors (in this case the NPN junction type or the P-point contact type) Q1–Q2, Q3–Q4, and Q5–Q6. In each said pair, the transistors have their collector electrodes connected to a common source of collector reverse biasing potential $V_C$. The emitter electrodes of each pair of transistors are connected together and then to a source of emitter forward biasing potential $V_E$ through resistors $R_{E1}$, $R_{E2}$, and $R_{E3}$ individual to each said transistor pair. Thus, the two transistors in each said pair are connected so that their collector-emitter paths are in parallel, with this parallel circuit in turn being connected in series with an individual emitter resistor $R_E$ between potentials $V_C$ and $V_E$. Consequently, if either transistor of any pair is caused to conduct, as by an appropriate positive going signal applied to its base electrode, current will flow through the emitter resistance $R_E$ common to said transistor pair.

In order to perform the two-out-of-three majority decision function, the base electrode of each transistor in each said pair is connected with the base electrode of but one transistor in a different pair. In FIGURE 1, the base electrodes of transistors Q1 through Q6 are uniquely identified by the respective lower case letters *a* through *f*. Thus, bases *a* and *f* are connected together, as are bases *b* and *c*, and *d* and *e*. In shorthand notation these base connections could be stated in the following manner: $f=a$, $c=b$, and $e=d$. Three input terminals 1, 2, and 3 to the circuit are provided, each connected to a different one of said base connected pairs. Input terminal 1 is connected to the base pair *a–f*, input terminal 2 is connected to base pair *b–c*, and input terminal 3 is connected to base pair *d–e*. A different two-level signal is then selectively applied to each of the three input terminals, these input signals being identified by the upper case letters A, B, and C in FIGURE 1. For the purpose of this description, one signal level possible at each input terminal is considered to be at some negative voltage value with respect to biasing source $E_E$ so as to reverse bias, or in other words, turn off those transistors the bases to which it is applied. Said negative signal level may be representative of a binary 0 value. The other signal level possible at each input terminal is more positive so as to forward bias each transistor to which it is applied and thus permit current conduction through its collector-emitter path. This higher signal level may be taken to represent a binary value of 1.

A multiple emitter transistor Q8 of the same polarity (NPN in the particular embodiment of FIGURE 1) is connected with each of its emitters joined to the emitters of a different one of the transistor pairs at junctions 5, 6, and 7. The collector of transistor Q8 is connected at junction 4 to the reverse biasing source $V_C$ through a resistance $R_B$, while its base electrode is connected to a source of biasing potential $V_B$. Some collector current will flow through Q8 in the event that any one or more of its multiple emitter-base junctions is forward biased by a relatively negative going signal applied to said emitter. It is only when all three emitters are reverse biased by positive voltage levels that any significant collector current flow ceases through transistor Q8. In order to establish a substantially constant voltage drop across resistor $R_B$, another NPN transistor is incorporated into the circuit such that its emitter is connected to the collector of transistor Q8 at junction 4, and its collector is connected to biasing source $V_C$ so as to maintain its emitter-base junction in a forward biased condition. This condition in turn maintains a constant potential drop across the collector-emitter path of transistor Q7 as long as emitter current is permitted to flow therethrough, which will be the case whenever there is any significant collector current in transistor Q8. Consequently, as long as there is at least one emitter of transistor Q8 forward biased by a negative input thereto, the potential appearing at junction 4 will be at some substantially fixed, predetermined first voltage level. However, when all of the Q8 emitters are reverse biased so as to completely turn off said transistor, the potential at junction 4 rises toward the voltage of source $V_C$.

FIGURE 1 further includes an output amplifying element comprised of transistor Q9 of like polarity which is connected as an emitter follower to provide a low impedence output and proper voltage translation so as to make the output voltage compatible with the input signal requirements. Transistor Q9 has its collector connected to the reverse biasing source $V_C$ and its emitter connected through a load resistor $R_0$ to source $V_E$. An output terminal 8 is taken from the emitter of transistor Q9, on which appears a two-level signal M according to the state of conduction in said output transistor. The base of Q9 is connected to junction 4 for receiving an input control signal therefrom. All biasing potentials and component values are adjusted such that transistor Q9 is turned on, i.e., it conducts to make high the output signal M, only for the higher of the two possible signal levels which appears at junction 4 when all Q8 emitters are reverse biased by positive signals at all junctions 5, 6, and 7.

FIGURE 1 operates in the following manner. If the input signals A, B, and C are all at the negative level (e.g., binary 0) which prevents conduction in any transistor pair, then the potentials appearing at junctions 5, 6, and 7 are also negative and approach the value of source $V_E$ so as to forward bias all three of the Q8 emitters. The resulting Q8 collector current through resistor $R_B$ makes the potential at junction 4 negative with respect to source $V_E$ so that transistor Q9 cannot conduct. With Q9 thus turned off, the output signal M appearing at terminal 8 is low, being approximately equal to the value of $V_E$.

If only one input signal A, B, or C goes to its more positive signal level, e.g. binary 1, then one transistor in each of two of said transistor pairs begins to conduct.

This raises the potential level at two of the three Q8 emitters. Assume, for example, that signal A applied to terminal 1 becomes high so as to turn on transistors Q1 and Q6. These two conducting transistors now cause current flow through emitter resistances $R_{E1}$ and $R_{E3}$, thus increasing the potential at junctions 5 and 7 to thereby terminate the conduction of two Q8 emitters so as to decrease but not stop current flow in the Q8 collector. Any decrease in the Q8 collector current is insufficient to raise the potential level at junction 4 because of the previously described clamping action of transistor Q7. Consequently, transistor Q9 is maintained in its cut off state so as to continue the low M output signal at terminal 8.

As another example of the operation of this FIGURE 1 circuit for a positive input applied to only one of its terminals 1, 2, or 3, assume now that only signal C becomes high so as to turn on transistors Q4 and Q5. This causes current conduction in resistors $R_{E2}$ and $R_{E3}$ which in turn raises the potentials at junctions 6 and 7 to again cut off only two of the Q8 emitters while leaving the third still conducting. Still further, if signal B is the only positive input to the circuit, then transistors Q2 and Q3 turn on to raise the potential only at junctions 5 and 6. It will therefore be appreciated that a single positive input to FIGURE 1 turns off but two of the Q8 emitters and thus fails to raise the potential at junction 4 to a value necessary to turn on transistor Q9.

Next assume that any two positive signals are applied to FIGURE 1, as for example, A and B. Transistors Q1, Q2, Q3, and Q6 are now made conducting so that current flows through all of the emitter resistances $R_{E1}$, $R_{E2}$, and $R_{E3}$. This raises the potentials at junctions 5, 6, and 7 to cut off all emitters of transistor Q8. Current flow in the Q8 collector terminates, and the potential at junction 4 rises towards the value $V_C$, thereby turning transistor Q9 to cause current flow through load resistor $R_0$ in a manner to make positive the signal M at output terminal 8. This rise in circuit output potential indicates the presence of at least two positive inputs thereto. Any other two positive input signals, such as A and C, or B and C, also causes the reverse biasing of all Q8 emitters to produce the positive signal M at output terminal 8.

In terms of Boolean algebra, the equation for the FIGURE 1 majority decision circuit may be stated as follows, using the letters M, A, B, and C to indicate high or positive level signals and with (+) representing the logical OR function, while the absence of a symbol between letters represents the logical AND function.

$$M=AB+AC+BC \quad (1)$$

As can readily be seen from the above description and equation, FIGURE 1 provides a high output for any two of its three possible high inputs. Output M also appears if all three inputs A, B, and C go positive. Consequently, FIGURE 1 performs a two-out-of-three "majority decision" function since at least two out of three inputs are required before a changed output is obtained. This particular logical function is obtained without need for any summation of currents such as is the case in most prior art "majority decision" circuits. Furthermore, emitter-coupled transistorized circuitry is provided which operates in the non-saturating current mode so as to eliminate transistor storage time. This means, therefore, that the propagation time of the circuit is considerably reduced over that of the prior art, and may be in the range of from 6 to 9 nanoseconds. The propagation time of the circuit is also approximately equal to that of a single stage of emitter coupled logic circuitry.

A circuit equivalent in function to FIGURE 1 can be easily provided by employing transistors of the PNP type with proper biasing voltages as known to those skilled in the art. Such a circuit would produce a significant low output signal for any two or more low input signals.

The FIGURE 1 circuit can be easily modified to perform other functions by merely changing the base electrode connections of the transistor pairs Q1–Q2, Q3–Q4, and Q5–Q6. FIGURE 2 shows the base electrodes of these six transistors each adapted to receive individually applied signals A through F, respectively, with the remaining components of the FIGURE 2 circuit (such as transistors Q7, Q8, and Q9) being as shown in FIGURE 1. For such base connections as illustrated in FIGURE 2, the logical equation for a high or positive level output signal M in response to various combinations of high level input signals A–F is given below, where ( ) represents the logical AND function:

$$M=(A+B)(C+D)(E+F) \tag{2}$$

In physical terms, Equation (2) above shows that a high level signal appears at output terminal 8 in response to a high level signal at either base *a* or base *b* (or both), *coupled* with a high level signal at either base *c* or base *d* (or both), *coupled* with a high level signal at either base *c* or base *f* (or both).

By instead connecting only base *b* of Q2 with base *a* of Q1 (i.e., $b=a$), so that signal A is simultaneously applied to Q1 and Q2 with there being no application of a signal B to the circuit, the logic equation becomes:

$$M=ACE+ADE+ACF+ADF \tag{3}$$

Equation 3 indicates that a high level M signal appears for high input signals applied to any one of the following four combinations of base electrodes:

(1) *a, b, c, e*
(2) *a, b, d, e*
(3) *a, b, c, f*
(4) *a, b, d, f*

Complementary values of input signals can also be applied to certain of the FIGURE 2 base electrodes. For example, assume that when a high signal A is applied to base *a*, its low complement signal $\bar{A}$ (where ¯ signifies negation) is applied to base *b* of Q2, either by means of an inverter connected between bases *a* and *b* with signal A then being applied only to base *a*, or by two complement outputs of a flip-flop holding the signal A bit value. Shorthand notation for this base connection is $b=\bar{a}$. Thus, additional representative base connections and corresponding functions are given below in logical Equations 4 through 9:

| Base Connections | Functions |
|---|---|
| $c=a$ | (4) $M=(A+BD)(E+F)$ |
| $c=\bar{a}$ | (5) $M=(\bar{A}B+BD+AD)(E+F)$ |
| $d=\bar{a}$, $e=\bar{b}$, $f=\bar{c}$ | (6) $M=A\bar{B}C+\bar{A}B\bar{C}$ |
| $c=a$, $e=a$ | (7) $M=A+BDF$ |
| $b=\bar{a}$, $e=\bar{c}$, $f=\bar{d}$ | (8) $M=D\bar{C}+\bar{D}C$ |
| $c=a$, $d=b$, $e=\bar{a}$, $f=\bar{b}$ | (9) $M=\bar{A}B+A\bar{B}$ |

Equations 4 and 7 above do not employ complement input signals and so may be interpreted as was Equation 2. Thus, if base *c* in FIGURE 2 is connected with base *a*, without any signal C ever being applied to base *c*, Equation 4 shows that a high output is obtained from terminal 8 for any one of the following four combinations of high input signals:

(1) A, E
(2) A, F
(3) B, D, E
(4) B, D, F

With the Equation 7 base connections, i.e. base *c* connected to base *a*, and base *e* also connected to base *a* where signal A is applied but not signals C or E, the high signal M appears for any of the following two input signal combinations:

(1) A
(2) B, D, F

In Equation 5, the base connections of FIGURE 2 are such that signal A is applied to base *a* while the complement of signal A($\bar{A}$) is applied to base *c*, there being no signal C ever applied. Consequently, whenever a signal A is applied to the circuit, as indicated by a high level at base *a*, there will be no high signal $\bar{A}$ at base *c*, whereas a high signal $\bar{A}$ at base *c* means the absence of a high signal A at base *a*. The high output signal M therefore appears for any one of the following six input signal combinations:

(1) $\bar{A}$, B, E
(2) $\bar{A}$, B, E
(3) B, D, E
(4) B, D, F
(5) A, D, E
(6) A, D, F In view of the foregoing explanation of Equation 5, it is believed that the significance of Equations 6, 8, and 9 is obvious. Furthermore, other base connections in FIGURE 2 are possible besides those specifically set forth herein. Thus, while a preferred embodiment of the present invention has been shown and/or described, modifications may be made thereto by those skilled in the art without departing from the novel principles defined in the appended claims.

The embodiments of the invention in which an exclusive property or privilege is claimed are defined as follows:

1. A solid state logic circuit comprising:

(a) three pairs of like polarity transistors, the transistors of each said pair having the same electrodes of their emitter-collector paths connected to a first source of biasing potential, having the other electrodes of their emitter-collector paths connected together and to a second source of biasing potential through a common impedance individual to said pair, and having their base electrodes adapted to receive at least one input electrical signal to selectively vary conduction in each said transistor;

(b) a multiple-emitter transistor having three emitter electrodes each of which is connected to both of said other electrodes of a different said transistor pair, said multiple-emitter transistor further having its base electrode connected to a source of biasing potential, and its collector electrode connected to a source of biasing potential through an impedance;

(c) an output terminal connected to said last named collector electrode; and (d) a voltage clamping means connected across said last named impedance for substantially maintaining the voltage at said output terminal constant for any number of forward biased emitters of said multiple-emitter transistor.

2. The circuit according to claim 1 wherein said other electrodes of each said transistor pair are those wherein increased current flow therethrough tends to reverse bias the emitter electrode connected therewith of said multiple emitter transistor.

3. A solid state logic circuit comprising:

(a) three pairs of like polarity transistors, the transistors of each said pair having their collector electrodes connected to a first source of reverse biasing potential, having their emitter electrodes connected together and to a second source of forward biasing potential through a common impedance individual to said pair, and having their base electrodes adapted to receive at least one input electrical signal to selectively vary conduction in each said transitor;

(b) a multiple-emitter transistor of like polarity having three emitter electrodes each of which is connected to both said emitter electrodes of a different said transistor pair, said multiple-emitter transistor further having its base electrode connected to a third source of biasing potential, and its collector electrode connected to said first source of biasing potential through an impedance;

(c) an output terminal connected to said last named collector electrode; and (d) a voltage clamping means connected across said last named impedance for substantially maintaining the voltage at said output terminal constant for any number of forward biased emitters of said multiple-emitter transistor.

4. The circuit according to claim 3 wherein all of said transistors are of the N–P–N type.

5. The circuit according to claim 3 wherein said voltage clamping means comprises an additional transistor of like polarity having both its base and collector electrodes connected to said first biasing source, and its emitter electrode connected to the collector electrode of said multiple emitter transistor.

6. The circuit according to claim 5 wherein all of said transistors are of the N–P–N type.

7. The circuit according to claim 3 wherein is further included amplifier means connected to said output terminal.

8. A solid state majority decision logic circuit comprising:

(a) three pairs of like polarity transistors, the transistors of each said pair having the same electrodes of their emitter-collector paths connected to a first source of biasing potential, and having the other electrodes of their emitter-collector paths connected together and to a second source of biasing potential through a common impedance individual to said pair, with the base electrode of each transistor in each of said pairs being connected with the base electrode of a single different transistor in another of said pairs;

(b) three input terminals each connected to a different one of said pairs of connected base electrodes and each adapted to receive an individual input electrical signal to selectively permit or prevent conduction in said transistors;

(c) a multiple-emitter transistor having three emitter electrodes each of which is connected to both of said other electrodes of a different said transistor pair, said multiple-emitter transistor being of a polarity such that each of its emitters is reversed biased by conduction through either transistor of the said pair to which it is connected, and further having its base electrode connected to a source of biasing potential and its collector electrode connected to a source of biasing potential through an impedance;

(d) an output terminal connected to said last named collector electrode; and (e) a voltage clamping means connected across said last named impedance for substantially maintaining the voltage at said output terminal constant for any number of forward biased emitters of said multiple emitter transistor.

9. A solid state majority decision logic circuit comprising:

(a) three pairs of like polarity transistors, the transistors of each said pair having their collector electrodes connected together and to a first source of biasing potential, and having their emitter electrodes connected together and to a second source of forward biasing potential through a common impedance individual to said pair, with the base electrode of each transistor in each of said pairs being connected with the base electrode of a single different transistor in another of said pairs;

(b) three input terminals each connected to a different one of said pairs of connected base electrodes and each adapted to receive an individual input electrical signal to selectively permit or prevent conduction in said transistors;

(c) a multiple-emitter transistor of like polarity having three emitter electrodes each of which is connected to both of said emitter electrodes of a different said transistor pair, said multiple-emitter transistor further having its base electrode connected to a third source of biasing potential, and its collector electrode connected to said first source of biasing potential through an impedance;

(d) an output terminal connected to said last named collector electrode; and (e) a voltage clamping means connected across said last named impedance for substantially maintaining the voltage at said output terminal constant for any number of forward biased emitters of said multiple-emitter transistor.

10. The circuit according to claim 9 wherein all of said transistors are of the N–P–N type.

11. The circuit according to claim 9 wherein said voltage clamping means comprises an additional transistor of like polarity having both its base and collector electrodes connected to said first biasing source, and its emitter electrode connected to the collector electrode of said multiple-emitter transistor.

12. The circuit according to claim 11 wherein all of said transistors are of the N–P–N type.

13. The circuit according to claim 9 wherein is further included amplifier means connected to said output terminal.

No references cited.

ARTHUR GAUSS, *Primary Examiner.*

R. H. PLOTKIN, *Assistant Examiner.*